United States Patent
Liu et al.

(10) Patent No.: US 10,428,257 B2
(45) Date of Patent: Oct. 1, 2019

(54) THERMAL INTERFACE MATERIAL WITH ION SCAVENGER

(71) Applicant: Honeywell International Inc., Morris Plains, NJ (US)

(72) Inventors: Ya Qun Liu, Pudong (CN); Liang Zeng, Shanghai (CN); Hui Wang, Shanghai (CN); Bright Zhang, Shanghai (CN); Hong Min Huang, Pudong (CN)

(73) Assignee: Honeywell International Inc., Morris Plains, NJ (US)

( * ) Notice: Subject to any disclaimer, the term of this patent is extended or adjusted under 35 U.S.C. 154(b) by 0 days.

(21) Appl. No.: 16/163,255

(22) Filed: Oct. 17, 2018

(65) Prior Publication Data

US 2019/0048245 A1 Feb. 14, 2019

Related U.S. Application Data

(63) Continuation of application No. 15/322,691, filed as application No. PCT/CN2014/081724 on Jul. 7, 2014, now Pat. No. 10,155,894.

(51) Int. Cl.
*H05K 7/20* (2006.01)
*C09K 5/14* (2006.01)
(Continued)

(52) U.S. Cl.
CPC ............... *C09K 5/14* (2013.01); *C08K 13/02* (2013.01); *C08L 23/0815* (2013.01); *C09K 5/063* (2013.01); *C09K 15/06* (2013.01); *C09K 15/22* (2013.01); *C09K 15/24* (2013.01); *C09K 15/30* (2013.01); *H01L 23/3675* (2013.01); *H01L 23/3737* (2013.01); *H01L 23/42* (2013.01); *H01L 24/32* (2013.01); *H05K 7/2039* (2013.01); *C08K 2201/001* (2013.01);
(Continued)

(58) Field of Classification Search
None
See application file for complete search history.

(56) References Cited

U.S. PATENT DOCUMENTS 1,655,133 A   1/1928 Clase
4,180,498 A  12/1979 Spivack
(Continued)

FOREIGN PATENT DOCUMENTS

CA    2311067 A1   1/2001
CN    1407141 A    4/2003
(Continued)

OTHER PUBLICATIONS

"Dynasylan 1146: Oligomeric Diamino-Silane-System" Evonik Industries, pp. 1-3, 2008.
(Continued)

*Primary Examiner* — Courtney L Smith
(74) *Attorney, Agent, or Firm* — Faegre Baker Daniels LLP

(57) ABSTRACT

A thermal interface material includes at least one polymer, at least one thermally conductive filler; and at least one ion scavenger. In some embodiments, the ion scavenger is a complexing agent selected from the group consisting of: nitrogen containing complexing agents, phosphorus containing complexing agents, and hydroxyl carboxylic acid based complexing agents.

20 Claims, 4 Drawing Sheets

(51) Int. Cl.
*H01L 23/42* (2006.01)
*C08K 13/02* (2006.01)
*C08L 23/08* (2006.01)
*C09K 5/06* (2006.01)
*C09K 15/06* (2006.01)
*C09K 15/22* (2006.01)
*C09K 15/24* (2006.01)
*C09K 15/30* (2006.01)
*H01L 23/367* (2006.01)
*H01L 23/00* (2006.01)
*H01L 23/373* (2006.01)
*G06F 1/20* (2006.01)

(52) U.S. Cl.
CPC ....... *C08L 2201/08* (2013.01); *C08L 2203/20* (2013.01); *G06F 1/20* (2013.01); *H01L 2224/2929* (2013.01); *H01L 2224/2939* (2013.01); *H01L 2224/29309* (2013.01); *H01L 2224/29311* (2013.01); *H01L 2224/29316* (2013.01); *H01L 2224/29318* (2013.01); *H01L 2224/29324* (2013.01); *H01L 2224/29339* (2013.01); *H01L 2224/29347* (2013.01); *H01L 2224/29355* (2013.01); *H01L 2224/29387* (2013.01); *H01L 2224/29393* (2013.01); *H01L 2224/32245* (2013.01); *H01L 2924/0002* (2013.01); *H01L 2924/0503* (2013.01); *H01L 2924/05032* (2013.01); *H01L 2924/05042* (2013.01); *H01L 2924/0542* (2013.01); *H01L 2924/0544* (2013.01); *H01L 2924/05432* (2013.01); *H01L 2924/12041* (2013.01); *H01L 2924/1432* (2013.01)

(56) References Cited

U.S. PATENT DOCUMENTS

| | | | |
|---|---|---|---|
| 4,265,026 A | 5/1981 | Meyer | |
| 4,446,266 A | 5/1984 | von Gentzkow et al. | |
| 4,459,185 A | 7/1984 | Obata et al. | |
| 4,565,610 A | 1/1986 | Nobel et al. | |
| 5,162,555 A | 11/1992 | Remmers et al. | |
| 5,167,851 A | 12/1992 | Jamison et al. | |
| 5,562,814 A | 10/1996 | Kirby | |
| 6,040,362 A | 3/2000 | Mine et al. | |
| 6,096,414 A | 8/2000 | Young | |
| 6,238,596 B1 | 5/2001 | Nguyen et al. | |
| 6,339,120 B1 | 1/2002 | Misra et al. | |
| 6,372,337 B2 | 4/2002 | Takahashi et al. | |
| 6,372,997 B1 | 4/2002 | Hill et al. | |
| 6,391,442 B1 | 5/2002 | Duvall et al. | |
| 6,400,565 B1 | 6/2002 | Shabbir et al. | |
| 6,432,320 B1 | 8/2002 | Bonsignore et al. | |
| 6,432,497 B2 | 8/2002 | Bunyan | |
| 6,451,422 B1 | 9/2002 | Nguyen | |
| 6,475,962 B1 | 11/2002 | Khatri | |
| 6,496,373 B1 | 12/2002 | Chung | |
| 6,500,891 B1 | 12/2002 | Kropp et al. | |
| 6,562,180 B1 | 5/2003 | Bohin et al. | |
| 6,597,575 B1 | 7/2003 | Matayabas et al. | |
| 6,605,238 B2 | 8/2003 | Nguyen et al. | |
| 6,610,635 B2 | 8/2003 | Khatri | |
| 6,616,999 B1 | 9/2003 | Freuler et al. | |
| 6,617,517 B2 | 9/2003 | Hill et al. | |
| 6,620,515 B2 | 9/2003 | Feng et al. | |
| 6,624,224 B1 | 9/2003 | Misra | |
| 6,649,325 B1 | 11/2003 | Gundale et al. | |
| 6,657,297 B1 | 12/2003 | Jewram et al. | |
| 6,673,434 B2 | 1/2004 | Nguyen | |
| 6,706,219 B2 | 3/2004 | Nguyen | |
| 6,761,928 B2 | 7/2004 | Hill et al. | |
| 6,764,759 B2 | 7/2004 | Duvall et al. | |
| 6,783,692 B2 | 8/2004 | Bhagwagar | |
| 6,791,839 B2 | 9/2004 | Bhagwagar | |
| 6,797,382 B2 | 9/2004 | Nguyen et al. | |
| 6,797,758 B2 | 9/2004 | Misra et al. | |
| 6,811,725 B2 | 11/2004 | Nguyen et al. | |
| 6,815,486 B2 | 11/2004 | Bhagwagar et al. | |
| 6,835,453 B2 | 12/2004 | Greenwood et al. | |
| 6,838,182 B2 | 1/2005 | Kropp et al. | |
| 6,874,573 B2 | 4/2005 | Collins et al. | |
| 6,900,163 B2 | 5/2005 | Khatri | |
| 6,908,669 B2 | 6/2005 | Nguyen | |
| 6,908,682 B2 | 6/2005 | Mistele | |
| 6,913,686 B2 | 7/2005 | Hilgarth | |
| 6,926,955 B2 | 8/2005 | Jayaraman et al. | |
| 6,940,721 B2 | 9/2005 | Hill | |
| 6,946,190 B2 | 9/2005 | Bunyan | |
| 6,975,944 B1 | 12/2005 | Zenhausern | |
| 6,984,685 B2 | 1/2006 | Misra et al. | |
| 7,013,965 B2 | 3/2006 | Zhong et al. | |
| 7,056,566 B2 | 6/2006 | Freuler et al. | |
| 7,074,490 B2 | 7/2006 | Feng et al. | |
| 7,078,109 B2 | 7/2006 | Hill et al. | |
| 7,135,232 B2 | 11/2006 | Yamada et al. | |
| 7,147,367 B2 | 12/2006 | Balian et al. | |
| 7,172,711 B2 | 2/2007 | Nguyen | |
| 7,241,707 B2 | 7/2007 | Meagley et al. | |
| 7,244,491 B2 | 7/2007 | Nguyen | |
| 7,291,396 B2 | 11/2007 | Huang et al. | |
| 7,294,394 B2 | 11/2007 | Jayaraman et al. | |
| RE39,992 E | 1/2008 | Misra et al. | |
| 7,328,547 B2 | 2/2008 | Mehta et al. | |
| 7,369,411 B2 | 5/2008 | Hill et al. | |
| 7,462,294 B2 | 12/2008 | Kumar et al. | |
| 7,465,605 B2 | 12/2008 | Raravikar et al. | |
| 7,550,097 B2 | 6/2009 | Tonapi et al. | |
| 7,572,494 B2 | 8/2009 | Mehta et al. | |
| 7,641,811 B2 | 1/2010 | Kumar et al. | |
| 7,682,690 B2 | 3/2010 | Bunyan et al. | |
| 7,695,817 B2 | 4/2010 | Lin et al. | |
| 7,700,943 B2 | 4/2010 | Raravikar et al. | |
| 7,744,991 B2 | 6/2010 | Fischer et al. | |
| RE41,576 E | 8/2010 | Bunyan et al. | |
| 7,816,785 B2 | 10/2010 | Iruvanti et al. | |
| 7,846,778 B2 | 12/2010 | Rumer et al. | |
| 7,850,870 B2 | 12/2010 | Ahn et al. | |
| 7,867,609 B2 | 1/2011 | Nguyen | |
| 7,955,900 B2 | 6/2011 | Jadhav et al. | |
| 7,960,019 B2 | 6/2011 | Jayaraman et al. | |
| 8,039,961 B2 | 10/2011 | Suhir et al. | |
| 8,076,773 B2 | 12/2011 | Jewram et al. | |
| 8,081,468 B2 | 12/2011 | Hill et al. | |
| 8,105,504 B2 | 1/2012 | Gerster et al. | |
| 8,110,919 B2 | 2/2012 | Jewram et al. | |
| 8,138,239 B2 | 3/2012 | Prack et al. | |
| 8,223,498 B2 | 7/2012 | Lima | |
| 8,308,861 B2 | 11/2012 | Rolland et al. | |
| 8,324,313 B2 | 12/2012 | Funahashi | |
| 8,373,283 B2 * | 2/2013 | Masuko | C08G 73/1042 257/783 |
| 8,431,647 B2 | 4/2013 | Dumont et al. | |
| 8,431,655 B2 | 4/2013 | Dershem | |
| 8,445,102 B2 | 5/2013 | Strader et al. | |
| 8,518,302 B2 | 8/2013 | Gerster et al. | |
| 8,535,478 B2 | 9/2013 | Pouchelon et al. | |
| 8,535,787 B1 | 9/2013 | Lima | |
| 8,557,896 B2 * | 10/2013 | Jeong | C08G 59/621 523/212 |
| 8,586,650 B2 | 11/2013 | Zhang et al. | |
| 8,587,945 B1 | 11/2013 | Hartmann et al. | |
| 8,618,211 B2 | 12/2013 | Bhagwagar et al. | |
| 8,632,879 B2 | 1/2014 | Weisenberger | |
| 8,633,478 B2 | 1/2014 | Cummings et al. | |
| 8,638,001 B2 * | 1/2014 | Kimura | C09J 7/10 257/783 |
| 8,647,752 B2 | 2/2014 | Strader et al. | |
| 8,758,892 B2 | 6/2014 | Bergin et al. | |
| 8,796,068 B2 | 8/2014 | Stender et al. | |
| 8,837,151 B2 | 9/2014 | Hill et al. | |
| 8,865,800 B2 | 10/2014 | Stammer et al. | |
| 8,917,510 B2 | 12/2014 | Boday et al. | |

(56) References Cited

U.S. PATENT DOCUMENTS

| | | |
|---|---|---|
| 8,937,384 B2 | 1/2015 | Bao et al. |
| 9,055,694 B2 | 6/2015 | Lima |
| 9,070,660 B2 | 6/2015 | Lowe et al. |
| 9,080,000 B2 | 7/2015 | Ahn et al. |
| 9,222,735 B2 | 12/2015 | Hill et al. |
| 9,260,645 B2 | 2/2016 | Bruzda |
| 9,392,730 B2 | 7/2016 | Hartmann et al. |
| 9,481,851 B2 | 11/2016 | Matsumoto et al. |
| 9,527,988 B2 | 12/2016 | Habimana et al. |
| 9,537,095 B2 | 1/2017 | Stender et al. |
| 9,593,209 B2 | 3/2017 | Dent et al. |
| 9,593,275 B2 | 3/2017 | Tang et al. |
| 9,598,575 B2 | 3/2017 | Bhagwagar et al. |
| 10,155,894 B2 * | 12/2018 | Liu .................... C09K 5/14 |
| 2002/0018885 A1 | 2/2002 | Takahashi et al. |
| 2002/0132896 A1 | 9/2002 | Nguyen |
| 2003/0112603 A1 | 6/2003 | Roesner et al. |
| 2003/0128521 A1 | 7/2003 | Matayabas et al. |
| 2003/0151030 A1 | 8/2003 | Gurin |
| 2003/0159938 A1 | 8/2003 | Hradil |
| 2003/0203181 A1 | 10/2003 | Ellsworth et al. |
| 2003/0207064 A1 | 11/2003 | Bunyan et al. |
| 2003/0207128 A1 | 11/2003 | Uchiya et al. |
| 2003/0230403 A1 | 12/2003 | Webb |
| 2004/0069454 A1 | 4/2004 | Bonsignore et al. |
| 2004/0097635 A1 | 5/2004 | Fan et al. |
| 2004/0149587 A1 | 8/2004 | Hradil |
| 2004/0161571 A1 | 8/2004 | Duvall et al. |
| 2004/0206941 A1 | 10/2004 | Gurin |
| 2005/0020738 A1 | 1/2005 | Jackson et al. |
| 2005/0025984 A1 | 2/2005 | Odell et al. |
| 2005/0072334 A1 | 4/2005 | Czubarow et al. |
| 2005/0148721 A1 | 7/2005 | Tonapi et al. |
| 2005/0228097 A1 | 10/2005 | Zhong |
| 2005/0287362 A1 | 12/2005 | Garcia-Ramirez et al. |
| 2006/0057364 A1 | 3/2006 | Nguyen |
| 2006/0208354 A1 | 9/2006 | Liu et al. |
| 2006/0228542 A1 | 10/2006 | Czubarow |
| 2006/0260948 A2 | 11/2006 | Zschintzsch et al. |
| 2006/0264566 A1 | 11/2006 | Cassar et al. |
| 2007/0051773 A1 | 3/2007 | Ruchert et al. |
| 2007/0097651 A1 | 5/2007 | Canale et al. |
| 2007/0131913 A1 | 6/2007 | Cheng et al. |
| 2007/0161521 A1 | 7/2007 | Sachdev et al. |
| 2007/0164424 A1 | 7/2007 | Dean et al. |
| 2007/0179232 A1 | 8/2007 | Collins et al. |
| 2007/0249753 A1 | 10/2007 | Lin et al. |
| 2008/0044670 A1 | 2/2008 | Nguyen |
| 2008/0116416 A1 | 5/2008 | Chacko |
| 2008/0141629 A1 | 6/2008 | Alper et al. |
| 2008/0149176 A1 * | 6/2008 | Sager ................. B22F 1/0018 |
| | | 136/262 |
| 2008/0291634 A1 | 11/2008 | Weiser et al. |
| 2008/0302064 A1 | 12/2008 | Rauch |
| 2009/0111925 A1 | 4/2009 | Burnham et al. |
| 2009/0184283 A1 | 7/2009 | Chung et al. |
| 2010/0048435 A1 | 2/2010 | Yamagata et al. |
| 2010/0048438 A1 | 2/2010 | Carey et al. |
| 2010/0075135 A1 | 3/2010 | Kendall et al. |
| 2010/0129648 A1 | 5/2010 | Xu et al. |
| 2010/0197533 A1 | 8/2010 | Kendall et al. |
| 2011/0121435 A1 * | 5/2011 | Mitsukura ......... C08G 73/1042 |
| | | 257/632 |
| 2011/0141698 A1 | 6/2011 | Chiou et al. |
| 2011/0187009 A1 * | 8/2011 | Masuko ............. C08G 73/1042 |
| | | 257/798 |
| 2011/0192564 A1 | 8/2011 | Mommer et al. |
| 2011/0204280 A1 | 8/2011 | Bruzda |
| 2011/0265979 A1 | 11/2011 | Chen et al. |
| 2011/0294958 A1 | 12/2011 | Ahn et al. |
| 2011/0308782 A1 | 12/2011 | Merrill et al. |
| 2012/0060826 A1 | 3/2012 | Weisenberger |
| 2012/0195822 A1 | 8/2012 | Werner et al. |
| 2012/0253033 A1 | 10/2012 | Boucher et al. |
| 2012/0285673 A1 | 11/2012 | Cola et al. |
| 2012/0288725 A1 | 11/2012 | Tanaka et al. |
| 2013/0199724 A1 | 8/2013 | Dershem |
| 2013/0248163 A1 | 9/2013 | Bhagwagar et al. |
| 2013/0265721 A1 | 10/2013 | Strader et al. |
| 2013/0288462 A1 | 10/2013 | Stender et al. |
| 2013/0299140 A1 | 11/2013 | Ling et al. |
| 2014/0190672 A1 | 7/2014 | Swaroop et al. |
| 2015/0125646 A1 | 5/2015 | Tournilhac et al. |
| 2015/0138739 A1 * | 5/2015 | Hishiki .................. H05K 3/305 |
| | | 361/760 |
| 2015/0158982 A1 * | 6/2015 | Saito ..................... C08K 5/5425 |
| | | 524/588 |
| 2015/0183951 A1 | 7/2015 | Bhagwagar et al. |
| 2015/0275060 A1 | 10/2015 | Kuroda et al. |
| 2015/0279762 A1 | 10/2015 | Lowe et al. |
| 2016/0160102 A1 * | 6/2016 | Minegishi ............... G03F 7/038 |
| | | 257/783 |
| 2016/0160104 A1 | 6/2016 | Bruzda et al. |
| 2016/0226114 A1 | 8/2016 | Hartmann et al. |
| 2016/0272839 A1 * | 9/2016 | Yamamoto ............... C08K 3/00 |
| 2017/0009362 A1 | 1/2017 | Werner et al. |
| 2017/0107415 A1 | 4/2017 | Shiono |
| 2017/0137685 A1 | 5/2017 | Liu et al. |
| 2017/0167716 A1 | 6/2017 | Ezaki et al. |
| 2017/0226396 A1 | 8/2017 | Yang et al. |
| 2017/0243849 A1 * | 8/2017 | Sasaki ..................... C08K 3/08 |
| 2017/0317257 A1 | 11/2017 | Ezaki et al. |
| 2017/0321100 A1 * | 11/2017 | Zhang ..................... C09K 5/14 |
| 2018/0030327 A1 | 2/2018 | Zhang et al. |
| 2018/0030328 A1 | 2/2018 | Zhang et al. |
| 2018/0085977 A1 | 3/2018 | Ezaki |
| 2018/0194982 A1 | 7/2018 | Ezaki et al. |
| 2018/0267315 A1 | 9/2018 | Yonemura |
| 2018/0358283 A1 | 12/2018 | Zhang et al. |
| 2019/0085225 A1 | 3/2019 | Zhang et al. |

FOREIGN PATENT DOCUMENTS

| | | |
|---|---|---|
| CN | 1456710 A | 11/2003 |
| CN | 1549875 A | 11/2004 |
| CN | 1970666 A | 5/2007 |
| CN | 101067030 A | 11/2007 |
| CN | 101090922 B | 12/2007 |
| CN | 101445627 A | 6/2009 |
| CN | 101735619 B | 6/2010 |
| CN | 101835830 B | 9/2010 |
| CN | 102134474 B | 7/2011 |
| CN | 102341474 B | 2/2012 |
| CN | 102627943 A | 8/2012 |
| CN | 102348763 B | 4/2013 |
| CN | 103087389 A | 5/2013 |
| CN | 103102552 A | 5/2013 |
| CN | 103102689 A | 5/2013 |
| CN | 103131138 B | 6/2013 |
| CN | 103214848 A | 7/2013 |
| CN | 103254647 A | 8/2013 |
| CN | 103333447 A | 10/2013 |
| CN | 103409116 B | 11/2013 |
| CN | 103436027 B | 12/2013 |
| CN | 103709757 A | 4/2014 |
| CN | 103756631 A | 4/2014 |
| CN | 103773322 A | 5/2014 |
| CN | 103849356 A | 6/2014 |
| CN | 103865271 B | 6/2014 |
| CN | 104098914 A | 10/2014 |
| CN | 104140678 B | 11/2014 |
| CN | 104152103 A | 11/2014 |
| CN | 104449550 A | 3/2015 |
| CN | 104497574 A | 4/2015 |
| CN | 104513487 A | 4/2015 |
| CN | 104804705 A | 7/2015 |
| CN | 104861661 A | 8/2015 |
| CN | 105111750 A | 12/2015 |
| CN | 105349113 A | 2/2016 |
| CN | 105419339 A | 3/2016 |
| CN | 105670555 A | 6/2016 |
| CN | 105838322 A | 8/2016 |
| CN | 105925243 A | 9/2016 |
| CN | 105980512 A | 9/2016 |

(56) References Cited

FOREIGN PATENT DOCUMENTS

| | | |
|---|---|---|
| EP | 1224669 B1 | 7/2002 |
| EP | 1149519 B1 | 11/2004 |
| EP | 1514956 B1 | 3/2005 |
| EP | 1629059 B1 | 3/2006 |
| EP | 2194165 A1 | 6/2010 |
| FR | 2848215 A1 | 6/2004 |
| GB | 2508320 B | 5/2014 |
| JP | 57027188 B | 6/1982 |
| JP | 0543116 B2 | 5/1986 |
| JP | 3662715 B2 | 1/1991 |
| JP | 02611364 B2 | 5/1997 |
| JP | 2000143808 A | 5/2000 |
| JP | 2001139818 A | 5/2001 |
| JP | 2002003830 A | 1/2002 |
| JP | 100479857 B1 | 7/2003 |
| JP | 2007002002 A | 1/2007 |
| JP | 4016326 B2 | 12/2007 |
| JP | 2008063412 A | 3/2008 |
| JP | 5269366 B2 | 3/2009 |
| JP | 2009102577 A | 5/2009 |
| JP | 5137538 B2 | 6/2009 |
| JP | 2009138036 A | 6/2009 |
| JP | 4288469 B2 | 7/2009 |
| JP | 5607298 B2 | 3/2010 |
| JP | 5390202 B2 | 8/2010 |
| JP | 2010248277 A | 11/2010 |
| JP | 2010278115 A | 12/2010 |
| JP | 5318733 B2 | 6/2011 |
| JP | 2011165792 A | 8/2011 |
| JP | 5687167 B2 | 4/2013 |
| JP | 5463116 B2 | 4/2014 |
| JP | 5944306 B2 | 7/2014 |
| JP | 5372270 B1 | 9/2014 |
| JP | 2014194006 A | 10/2014 |
| KR | 20070116654 A | 12/2007 |
| TW | 201527309 A | 7/2015 |
| WO | 1997026297 A1 | 7/1997 |
| WO | WO0120618 A1 | 3/2001 |
| WO | 03052818 A1 | 6/2003 |
| WO | 2003064148 A1 | 8/2003 |
| WO | 2004008497 A2 | 1/2004 |
| WO | 2004022330 A1 | 3/2004 |
| WO | 2005021257 A1 | 3/2005 |
| WO | 200511146 A1 | 11/2005 |
| WO | 2005119771 A1 | 12/2005 |
| WO | 2006023860 A2 | 3/2006 |
| WO | 2007027670 A1 | 3/2007 |
| WO | 2008014171 A2 | 1/2008 |
| WO | 2008103219 A1 | 8/2008 |
| WO | 2008121491 A1 | 10/2008 |
| WO | 2008121970 A1 | 10/2008 |
| WO | 2009032212 A1 | 3/2009 |
| WO | 2013191116 A1 | 12/2013 |
| WO | 2014007119 A1 | 1/2014 |
| WO | 2014160067 A1 | 10/2014 |
| WO | 2015179056 A1 | 11/2015 |
| WO | 2016004565 A1 | 1/2016 |
| WO | 2016103424 A1 | 6/2016 |
| WO | 2018068222 A1 | 4/2018 |

OTHER PUBLICATIONS

"Hi-Flow 225F-AC Reinforced, Phase Change Thermal Interface Material," The Bergquist Company, 1 page, available at least as early as Aug. 31, 2017.

"Semicosil 9212A" Wacker Silicones Material Safety Data Sheet, pp. 1-8, printed Dec. 11, 2009.

"Semicosil 9212B" Wacker Silicones Material Safety Data Sheet, pp. 1-8, printed Dec. 11, 2009.

"THERM-A-GAP HCS10,569,570,579 and 580 Thermally Conductive Gap Filler Pads," Parker Chomerics, Engineering Your Success, pp. 11-12, available at least as early as the filing date of the present application.

Aranzabe, Estibaliz, et al. "More than Color: Pigments with Thermal Storage Capacity; Processing and Degradation Behavior." Advances in Materials Physics and Chemistry, 5:171-184, 2015.

Extended European Search Report issued in EP Application No. 14897036.1, dated Jul. 2, 2018, 7 pages.

Extended Search Report issued in EP Application 14907530.1, dated Jun. 27, 2018, 9 pages.

Fink, Johannes Karl. "Chapter 18: Metal Deactivators." in: A Concise Introduction to Additives for Thermoplastic Polymers, Wiley-Scrivener, pp. 165-171, Jan. 1, 2010.

Gowda, Arun, et al. "Choosing the Right Thermal Interface Material." Solid State Technology, Insights for Electronics Manufacturing, Online Blog, 9 pages, 2005. Retrieved May 25, 2017 from the Internet <http://electroiq.com/blog/2005/03/choosing-the-right-thermal-interface-material/.

International Search Report and Written Opinion issued in PCT/CN2014/081724, dated Apr. 1, 2015, 12 pages.

International Search Report and Written Opinion issued in PCT/CN2014/093138, dated Sep. 6, 2015, 8 pages.

International Search Report and Written Opinion issued in PCT/CN2016/101874, dated Apr. 28, 2017, 12 pages.

International Search Report and Written Opinion issued in PCT/US2014/068033, dated Mar. 26, 2015, 12 pages.

International Search Report and Written Opinion issued in PCT/US2017/041498, dated Oct. 20, 2017, 10 pages.

Martyak et al., On the oxidation of tin(II) in methanesulfonate solutions and the role of sulfate, Galvanotechnik (2005), 96(3), 594-601 (Abstract).

Ping, Ding, et al. "Preparation and Application Research of Novel Silicone Gel for High-Power IGBT." Insulating Materials, 47(2):52-55, Chinese text with English translation of Abstract, 2014.

Ramaswamy, C., et al. "Phase Change Materials as a Viable Thermal Interface Material for High-Power Electronic Applications." The Ninth Intersociety Conference on Thermal and Thermomechanical Phenomena in Electronic Systems, IEEE, 2:687-691, 2004.

Search Report issued in CN application 201480066502.2, dated May 18, 2017, 2 pages.

Singaporean Search Report and Written Opinion issued in SG Application No. 11201704238Y, completed May 18, 2018, 9 pages.

Dow Corning® Two-Part RTV Silicone Sealant: Total Assembly Solutions for Home Appliance Production; www.dowcorning.com; Form No. 80-3375-01; 6 pages.

Evonik, Silanes for Adhesives and Sealants, 2013, p. 1-24.

Extended European Search Report issued in EP Application 14867847.7, dated Jun. 26, 2017, 7 pages.

International Preliminary Report on Patentability issued in PCT/CN2016/075827, dated Sep. 20, 2018, 5 pages.

International Search Report and Written Opinion issued in PCT/CN2016/075827, dated Dec. 1, 2016, 7 pages.

International Search Report and Written Opinion issued in PCT/US2018/049218, dated Dec. 28, 2018, 13 pages.

Singaporean Written Opinion issued in SG Application No. 11201704238Y, completed Feb. 7, 2019, 7 pages.

Wacker Silicones, Catalyst EP/Inhibitor PT 88 product data sheet, p. 1-3, Oct. 6, 2008.

Yasuhiro Aoyagi et al., "Effects of antioxidants and the solild component on the thermal stability of polyol-ester-based thermal pastes", J Mater Sci (2007) 42:2358-2375; Mar. 12, 2007.

Yasuhiro Aoyagi et al., "Polyol-Based Phase-Change Thermal Interface Materials", Journal of Electronic Materials, vol. 35, No. 3, (2006); pp. 416-424.

Yunsheng Xu et al., "Lithium Doped Polyethylene-Glycol-Based Thermal Interface Pastes for High Thermal Contact conductance", Transactions of the ASME; Journal of Electronic Packagiing, vol. 124, Sep. 2002; pp. 188-191.

* cited by examiner

Combine the two above, as below

THERMAL INTERFACE MATERIAL WITH ION SCAVENGER

CROSS REFERENCE TO RELATED APPLICATIONS

This application is continuation of U.S. patent application Ser. No. 15/322,691, filed Dec. 28, 2016, which is a U.S. national stage application of PCT/CN2014/081724, filed 7 Jul. 2014, published as WO 2016/004565 on 14 Jan. 2016, which are both herein incorporated by reference in their entireties.

FIELD OF THE INVENTION

The present disclosure relates generally to thermal interface materials, and more particularly to thermal interface materials that include an ion scavenger.

DESCRIPTION OF THE RELATED ART

Thermal interface materials (TIMs) are widely used to dissipate heat from electronic components, such as central processing units, video graphics arrays, servers, game consoles, smart phones, LED boards, and the like. Thermal interface materials are typically used to transfer excess heat from the electronic component to a heat spreader, such as a heat sink.

A typical electronics package structure 10 including thermal interface materials is illustrated in FIG. 1. The electronics package structure 10 illustratively includes a heat generating component, such as an electronic chip 12, and one or more heat dissipating components, such as a heat spreader 14, and a heat sink 16. Illustrative heat spreaders 14 and heat sinks comprise a metal, metal alloy, or metal-plated substrate, such as copper, copper alloy, aluminum, aluminum alloy, or nickel-plated copper. TIM materials, such as TIM 18 and TIM 20, provide a thermal connection between the heat generating component and the one or more heat dissipating components. Electronics package structure 10 includes a first TIM 18 connecting the electronic chip 12 and heat spreader 14. TIM 18 is typically referred to as a "TIM 1". Electronics package structure 10 includes a second TIM 20 connecting the heat spreader 14 and heat sink 16. TIM 18 is typically referred to as a "TIM 2". In another embodiment, electronics package structure 10 does not include a heat spreader 14, and a TIM (not shown) connects the electronic chip 12 directly to the heat sink 16. Such a TIM connecting the electronic chip 12 directly to the heat sink 16 is typically referred to as a TIM 1.5.

Thermal interface materials include thermal grease, grease-like materials, elastomer tapes, and phase change materials. Traditional thermal interface materials include components such as gap pads and thermal pads.

Exemplary thermal interface materials are disclosed in the following patents and applications, the disclosures of which are hereby incorporated by reference in their entirety: U.S. Pat. Nos. 6,238,596, 6,451,422, 6,605,238, 6,673,434, 6,706,219, 6,797,382, 6,811,725, 7,172,711, 7,244,491, 7,867,609, U.S. 2007/0051773, U.S. 2008/0044670, U.S. 2009/0111925, U.S. 2010/0129648, and U.S. 2011/0308782.

Degradation of thermal interface materials typically occurs through polymer chain scission, such as illustrated in FIG. 2A. As shown in FIG. 2A, the initiation energy produces the initiation reaction RH→R.+H. to form the radical R. This radical combines with an oxygen molecule to form the peroxide radical ROO. The peroxide radical can bond to a proton transferred from another R group to form the peroxide ROOH, as well as a new R. radical, which can combine with a new oxygen molecule. The branching reaction ROOH→RO.+HO. proceeds to form both a RO. radical and a HO. radical. The RO. and HO. are involved in scission of the remaining polymer chain, as well as embrittlement of the thermal interface material through unwanted crosslinking.

In a typical auto-oxidation cycle, the radical initiation reaction speed depends on provision of the initiation energy to produce the R. radical, as well as contaminants in the material. However, both the initiation reaction and the branching reaction are relatively slow due to relatively high activation energies involved in each reaction.

As shown in FIG. 2B, each of the initiation reaction and the branching reaction can be catalyzed by a metal ion. These metal ion catalyzed reactions have relatively low activation energies compared to the uncatalyzed reactions illustrated in FIG. 2A. This results in the generation of more radicals than the uncatalyzed cycle of FIG. 2A, which leads to faster degradation of the thermal interface material.

As illustrated in FIG. 1, at least one surface of a TIM material, such as TIM 18 or TIM 20, may be in direct contact with a metal surface, such as heat spreader 14 or heat sink 16. Such metal surfaces may provide metal ions to catalyze the initiation and branching reactions, such as from metal oxides that may form on the surface. For example, copper ions may interact with a polymer comprising the TIM, particularly in the presence of heat, to form free radicals in the polymer that initiation chain scission that degrades the polymer during service.

Improvements in the foregoing are desired.

SUMMARY OF THE INVENTION

The present disclosure provides thermal interface materials that are useful in transferring heat from heat generating electronic devices, such as computer chips, to heat dissipating structures, such as heat spreaders and heat sinks.

According to an embodiment of the present disclosure, the thermal interface material includes at least one polymer, at least one thermally conductive filler, and at least one ion scavenger.

In a more particular embodiment, the ion scavenger is a complexing agent selected from the group consisting of: nitrogen containing complexing agents, phosphorus containing complexing agents, hydroxyl carboxylic acid based complexing agents, and combinations of the foregoing. In another more particular embodiment, the ion scavenger is selected from the group consisting of: an acid amide compound, a triazole compound, a tetrazole compound, a triazene compound, an oxamide compounds, a malonamide compound, and combinations of the foregoing. In another more particular embodiment, the ion scavenger is an acid amide compound. In another more particular embodiment, the ion scavenger is selected from the group consisting of: decamethylenedicarboxylic acid disalicyloylhydrazide; 3-(N-salicyloyl)amino-1,2,4-triazole; 2', 3-bis [[3-[3, 5-di-tert-butyl-4-hydroxyphenyl] propionic]]propionyl hydrazide, and combinations of the foregoing.

In another more particular embodiment, the ion scavenger is a compound according to any of Formula I to Formula XI or combinations thereof:

Formula I

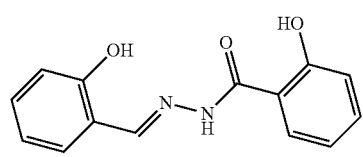
N-salicylidene-N'salicyloyl hydrazide

Formula II

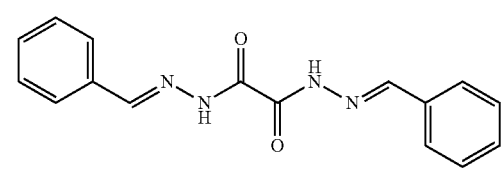
oxalyl bis(benzylidenehydrazide)

Formula III

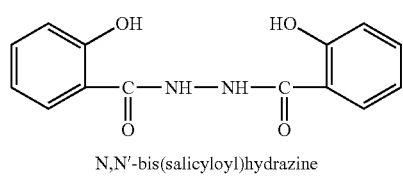
N,N'-bis(salicyloyl)hydrazine

Formula IV

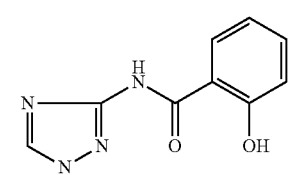
3-(N-salicyloyl)amino-1,2,4-triazole

Formula V

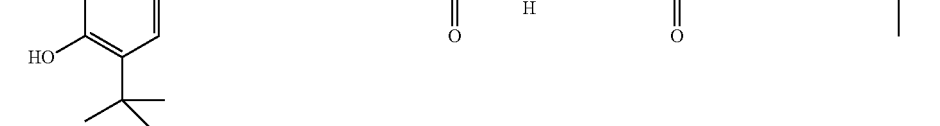
2,2'-oxamido bis[ethyl 3-(3,5-di-tert-butyl-4-hydroxyphenyl)propionate]

Formula VI

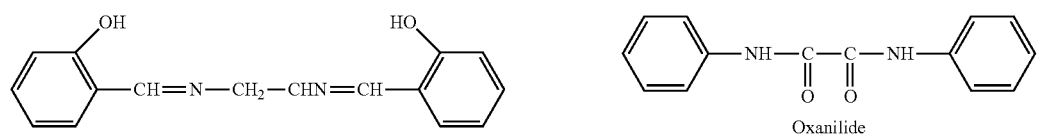
N,N'-bis(salycylidene) ethylenediamine

Formula VII

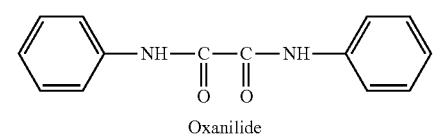
Oxanilide

Formula VIII

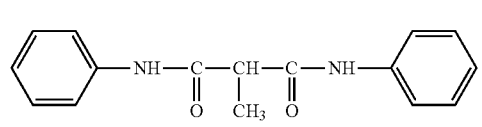
Methylmalonic acid dianilide

Formula IX

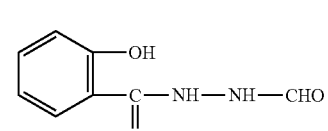
N-formyl-N'-salycyloyl hydrazine

Formula X

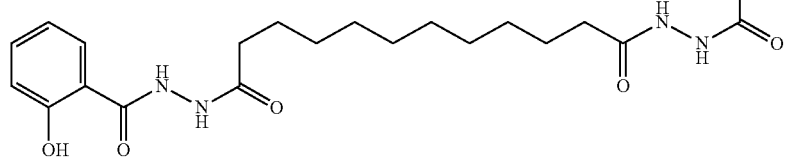
Decamethylenedicarboxylic acid disalicyloylhydrazide

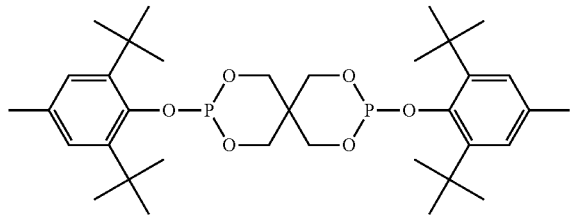

Bis(2,6-di-ter-butyl-4-methylphenyl)pentaerythritol-diphosphite

In a more particular embodiment of any of the above embodiments, the thermal interface material comprises 0.1 wt. % to 5 wt. % of the ion scavenger, based on the total weight of the thermal interface material. In a more particular embodiment, the thermal interface material comprises 0.5 wt. % to 1 wt. % of the ion scavenger, based on the total weight of the thermal interface material.

In a more particular embodiment of any of the above embodiments, the thermal interface material further comprises at least one phase change material. In an even more particular embodiment, the phase change material is a wax.

In a more particular embodiment of any of the above embodiments, the thermal interface material further comprises at least coupling agent. In an even more particular embodiment, the coupling agent material is selected from the group consisting of: a titanate coupling agent, a zirconate coupling agent, and a silane coupling agent, and combinations of the foregoing. In an even more particular embodiment, the coupling agent is a titanate coupling agent.

In a more particular embodiment of any of the above embodiments, the thermal interface material further comprises at least one crosslinker.

In a more particular embodiment of any of the above embodiments, the thermal interface material comprises: 5 wt. % to 10 wt. % of the at least one polymer; 50 wt. % to 95 wt. % of the at least one thermally conductive filler; and 0.1 wt. % to 5 wt. % of the ion scavenger, based on the total weight of the thermal interface material. In a first even more particular embodiment, the thermal interface material comprises: 2 wt. % to 5 wt. % of at least one wax; 0.1 to 0.5 wt. % of at least one antioxidant; 1 wt. % to 2 wt. % of at least one coupling agent; and 0.5 wt. % to 0.6 wt. % of at least one crosslinker based on the total weight of the thermal interface material; wherein the thermal interface material comprises 75 wt. % to 90 wt. % of the at least one thermally conductive filler, based on the total weight of the thermal interface material. In a second even more particular embodiment, the thermal interface material comprises: 2 wt. % to 5 wt. % of at least one wax; 0.1 to 0.5 wt. % of at least one antioxidant; 1 wt. % to 2 wt. % of at least one coupling agent; and 0.5 wt. % to 0.6 wt. % of at least one crosslinker based on the total weight of the thermal interface material; wherein the thermal interface material comprises 75 wt. % to 90 wt. % of the at least one thermally conductive filler, based on the total weight of the thermal interface material. In an even more particular embodiment, the thermal interface material comprises: 1.5 wt. % to 2 wt. % of at least one wax; 0.1 to 1 wt. % of at least one antioxidant; and 0.5 wt. % to 1 wt. % of at least one coupling agent; wherein the thermal interface material comprises 85 wt. % to 95 wt. % of the at least one thermally conductive filler, based on the total weight of the thermal interface material. In another even more particular embodiment, the thermal interface material further comprises 0.1 wt. % to 1 wt. % of at least one crosslinker.

According to an embodiment of the present disclosure, an electronic components includes a heat sink, an electronic chip, and a thermal interface material having a first surface layer and a second surface layer, the thermal interface material positioned between the heat sink and electronic chip, the thermal interface material including: at least one polymer; at least one thermally conductive filler; and at least one ion scavenger. In some embodiments, the thermal interface material is according to any of the above embodiments. In a first more particular embodiment, the first surface layer is in contact with a surface of the electronic chip and the second surface layer is in contact with the heat sink. In a second more particular embodiment, the electronic component further comprises a heat spreader positioned between the heat sink and the electronic chip, wherein the first surface layer is in contact with a surface of the electronic chip and the second surface layer is in contact with the heat spreader. In a third more particular embodiment, the electronic component further comprises a heat spreader positioned between the heat sink and the electronic chip, wherein the first surface layer is in contact with a surface of the heat spreader and the second surface layer is in contact with the heat sink.

BRIEF DESCRIPTION OF THE DRAWINGS

The above-mentioned and other features and advantages of this disclosure, and the manner of attaining them, will become more apparent and the invention itself will be better understood by reference to the following description of embodiments of the invention taken in conjunction with the accompanying drawings, wherein.

Corresponding reference characters indicate corresponding parts throughout the several views. The exemplifications set out herein illustrate exemplary embodiments of the invention and such exemplifications are not to be construed as limiting the scope of the invention in any manner.

DETAILED DESCRIPTION

A. Thermal Interface Material

The present invention relates to thermal interface materials (TIMs) useful in transferring heat away from electronic components. In one exemplary embodiment, the TIM comprises a polymer matrix, at least one thermally conductive filler, and at least one ion scavenger.

In some embodiments, the TIM may optionally include one or more of the following components: coupling agent, antioxidant, phase change material, and other additives.

Without wishing to be bound by any theory, it is believed that the addition of an ion scavenger inhibits metal ion-induced free radical formation. The ion scavenger is believed to capture and bind metal ions in a complex such that the metal ions no longer have an empty electron orbit and are effectively disabled from initiation the formation of free radicals in the polymer.

Figure 2A:
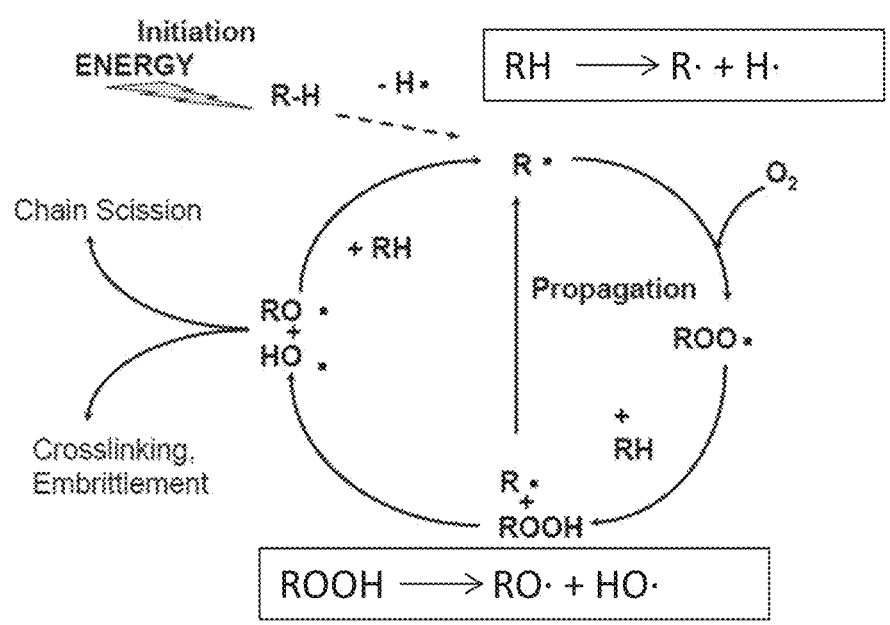
FIG. 2A illustrates a typical degradation mechanism for a TIM.
Figure 2B:
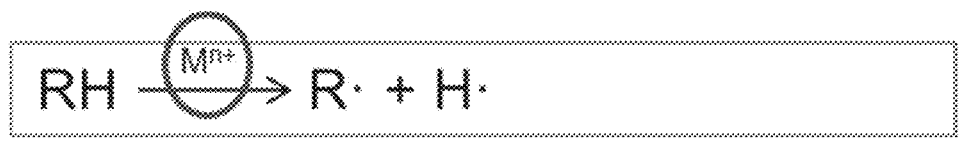
FIG. 2B illustrates a metal-catalyzed degradation mechanism.
Figure 2B:
Figure 2B:
Figure 2B:
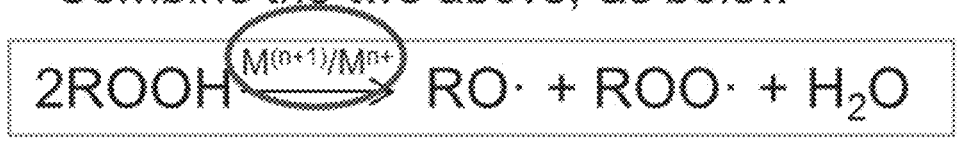
Figure 3:
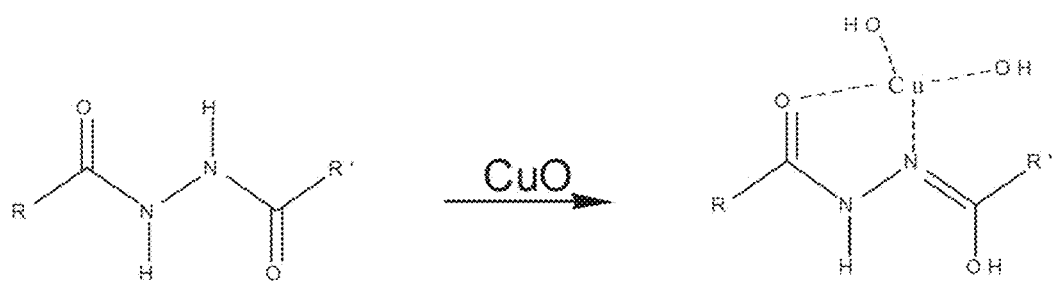
FIG. 3 illustrates an exemplary complexing reaction with an ion scavenger.

An exemplary complexing reaction is illustrated in FIG. 3. In FIG. 3, the ion scavenger, illustratively a dihydrazide, reacts with a metal ion, illustratively copper oxide. Without wishing to be bound by any particular theory, it is believed that the metal ion is attracted to one or more lone pairs of electrons on the ion scavenger. The attraction between the metal ion and lone pairs of electrons forms a complex, in which the metal ion no longer has an empty electron orbit and does not participate in the metal-catalyzed reactions of FIG. 2B.

As illustrated in the Examples presented below, the inclusion of an ion scavenger in the thermal interface material inhibited degradation of the polymer to a surprising extent.

1. Polymer

The TIM includes a polymer, such as an elastomer. In some embodiments, the polymer comprises a silicone rubber, a siloxane rubber, a siloxane copolymer, or other suitable silicone-containing rubber. In some embodiments, the polymer comprises one or more hydrocarbon rubber compounds, including saturated or unsaturated hydrocarbon rubber compounds.

Exemplary saturated rubbers include ethylene-propylene rubbers (EPR, EPDM), polyethylene/butylene, polyethylene-butylene-styrene, polyethylene-propylene-styrene, hydrogenated polyalkyldiene "mono-ols" (such as hydrogenated polybutadiene mono-ol, hydrogenated polypropadiene mono-ol, hydrogenated polypentadiene mono-ol), hydrogenated polyalkyldiene "diols" (such as hydrogenated polybutadiene diol, hydrogenated polypropadiene diol, hydrogenated polypentadiene diol) and hydrogenated polyisoprene, polyolefin elastomer, and blends thereof. In some embodiments, the polymer is a hydrogenated polybutadiene mono-ol.

Exemplary unsaturated rubbers include polybutadiene, polyisoprene, polystyrene-butadiene and blends thereof, or blends of saturated and unsaturated rubber compounds.

The TIM may comprise the one or more polymers in an amount as little as 1 wt. %, 2 wt. %, 5 wt. %, 6 wt. %, 7 wt. %, 8 wt. %, as great as 10 wt. %, 20 wt. %, 25 wt. %, 50 wt. %, or greater, or within any range defined between any two of the foregoing values, based on the total weight of the TIM.

2. Thermally Conductive Filler

The TIM includes one or more thermally conductive fillers. Exemplary thermally conductive fillers include metals, alloys, nonmetals, metal oxides and ceramics, and combinations thereof. The metals include, but are not limited to, aluminum, copper, silver, zinc, nickel, tin, indium, and lead. The nonmetal include, but are not limited to, carbon, graphite, carbon nanotubes, carbon fibers, graphenes, and silicon nitride. The metal oxide or ceramics include but not limited to alumina, aluminum nitride, boron nitride, zinc oxide, and tin oxide.

The TIM may comprise the one or more thermally conductive fillers in an amount as little as 10 wt. %, 20 wt. %, 25 wt. %, 50 wt. %, as great as 75 wt. %, 80 wt. %, 85 wt. %, 90 wt. %, 95 wt. %, or within any range defined between any two of the foregoing values, based on the total weight of the TIM.

3. Ion Scavenger

The TIM includes one or more ion scavengers. Exemplary ion scavengers include nitrogen containing complexing agents, phosphorous containing complexing agents, and hydroxyl carboxylic acid based complexing agents. In some exemplary embodiments, the ion scavenger is selected from acid amide compounds, such as hydrazide or dihydrazide. In some exemplary embodiments, the ion scavenger is selected from triazole compounds, tetrazole compounds, triazene compounds, oxamide compounds, or malonamide compounds. In some exemplary embodiments, the ion scavenger is selected from decamethylenedicarboxylic acid disalicyloylhydrazide; 3-(N-salicyloyl)amino-1,2,4-triazole; and 2', 3-bis [[3-[3, 5-di-tert-butyl-4-hydroxyphenyl] propionic]] propionyl hydrazide.

In another more particular embodiment, the ion scavenger is a compound according to any of Formula I to Formula XI or combinations thereof:

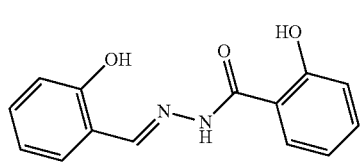

N-salicylidene-N'salicyloyl hydrazide

Formula I

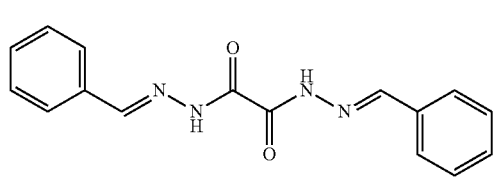

oxalyl bis(benzylidenehydrazide)

Formula II

-continued

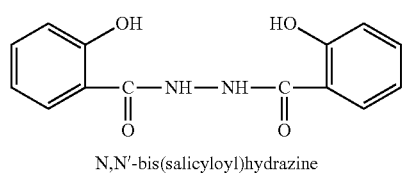

N,N'-bis(salicyloyl)hydrazine

Formula III

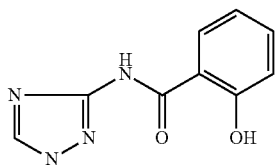

3-(N-salicyloyl)amino-1,2,4-triazole

Formula IV

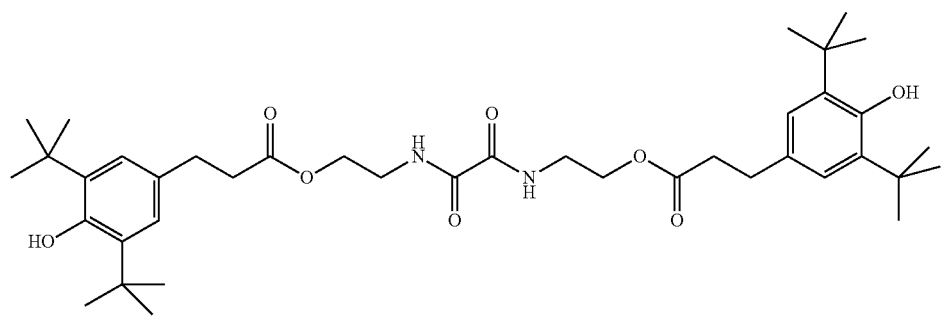

2,2'-oxamido bis[ethyl 3-(3,5-di-tert-butyl-4-hydroxyphenyl)propionate]

Formula V

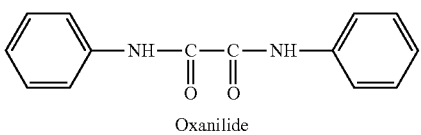

N,N'-bis(salycylidene) ethylenediamine

Oxanilide

Formula VI

Formula VII

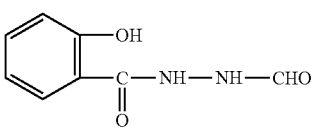

Methylmalonic acid dianilide

N-formyl-N'-salycyloyl hydrazine

Formula VIII

Formula IX

Decamethylenedicarboxylic acid disalicyloylhydrazide

Formula X

Bis(2,6-di-ter-butyl-4-methylphenyl)pentaerythritol-diphosphite

Formula XI

The TIM may comprise the one or more ion scavengers in an amount as little as 0.1 wt. %, 0.2 wt. %, 0.5 wt. %, 1 wt. % as great as 1.5 wt. %, 2 wt. %, 5 wt. %, 10 wt. %, or within any range defined between any two of the foregoing values, based on the total weight of the TIM.

4. Coupling Agent

In some exemplary embodiments, the TIM comprises one or more coupling agents. Exemplary coupling agents include organometallic compounds, such as titanate coupling agents or zircontate coupling agents, and organic compounds, such as silane coupling agents. Exemplary coupling agents include titanium IV 2,2 (bis 2-propenolatomethyl)butanolato, tris(dioctyl)pyrophosphato-O; zirconium IV 2,2 (bis 2-propenolatomethyl)butanolato, tris(diisooctyl)pyrophosphato-O; titanium IV 2-propanolato, tris(dioctyl)-pyrophosphato-O) adduct with 1 mole of diisooctyl phosphite; titanium IV bis(dioctyl)pyrophosphato-O, oxoethylenediolato, (Adduct), bis(dioctyl) (hydrogen)phosphite-O; titanium IV bis(dioctyl)pyrophosphato-O, ethylenediolato (adduct), bis (dioctyl)hydrogen phosphite; and zirconium IV 2,2-bis(2-propenolatomethyl) butanolato, cyclo di[2,2-(bis 2-propenolatomethyl) butanolato], pyrophosphato-O,O.

In some exemplary embodiments, the TIM may comprise the one or more coupling agents in an amount as little as 0.1 wt. %, 0.5 wt. %, 0.67 wt. %, 0.75 wt. %, as great as 1 wt. %, 1.5 wt. %, 2 wt. %, 5 wt. %, 10 wt. %, or within any range defined between any two of the foregoing values, based on the total weight of the TIM.

5. Antioxidant

In some exemplary embodiments, the TIM comprises one or more antioxidants. Exemplary antioxidants include phenol type, amine type antioxidants, or any other suitable type of antioxidant, or a combination thereof. The phenol or amine type antioxidant may also be a sterically hindered phenol or amine type antioxidant. Exemplary phenol type antioxidants include octadecyl 3-(3,5-di-(tert)-butyl-4-hydroxyphenyl) propionate. Exemplary amine type antioxidants include 2,6-di-tert-butyl-4-(4,6-bis(octylthio)-1,3,5-triazin-2-ylamino) phenol. Exemplary stearically hindered antioxidants include sterically hindered sulfur containing phenolic antioxidants. Exemplary antioxidants include the Irganox® antioxidants available from BASF.

Although ion scavengers and antioxidants both reduce oxidative degradation of the TIM, ion scavengers are believed to function by capturing and binding metal ions in a complex such that the metal ions no longer have a net charge and are effectively disabled from participating in the metal-catalyzed reactions of FIG. 2B. In contrast, antioxidants are generally believed to function by transferring electrons to an oxidizing agent, such as the radicals of FIG. 2A.

In some exemplary embodiments, the TIM may comprise the one or more antioxidants in an amount as little as 0.05 wt. %, 0.1 wt. %, 0.5 wt. %, 1 wt. % as great as 1.5 wt. %, 2 wt. %, 5 wt. %, 10 wt. %, or within any range defined between any two of the foregoing values, based on the total weight of the TIM.

6. Phase Change Material

In some exemplary embodiments, the TIM comprises one or more phase change materials. A phase change material is a material having a melting point or melting point range at or below the operating temperature of a portion of an electronic device in which the TIM is to be used. An exemplary phase change material is a wax. Other exemplary phase change materials include low melting alloys, such as Wood's metal, Field's metal, or a metal or alloy having a melting point between about 20° C. and 90° C.

In some embodiments, the phase change material has a phase change temperature as low as 20° C., 30° C., 40° C., 45° C. 50° C., as high as 60° C., 70° C., 80° C., 90° C., 100° C., 110° C., or within any range defined between any two of the foregoing values. In some more particular embodiments, the phase change material has a phase change temperature as low as 30° C., 40° C., 45° C. as high as 50° C., 60° C., 70° C., or within any range defined between any two of the foregoing values.

Exemplary waxes include polyethylene (PE) wax, paraffin wax, AC-1702, a polyethylene wax, AC-430, a copolymer of ethylene-vinyl acetate wax, and AC-6702, an oxidized polyethylene wax, each available from Honeywell International Inc., a polyethylene wax blended with polytetrafluoroethylene such as PEW-0602F wax available from Nanjing Tianshi New Material Technologies, TAC wax, available from The International Group, Inc., and RT44HC, available from Hangzhou Ruhr Tech.

The TIM may comprise the one or more phase change materials in an amount as little as 0.5 wt. %, 1 wt. %, 2 wt. %, 3 wt. %, 5 wt. %, 10 wt. %, as great as 20 wt. %, 25 wt. %, 50 wt. %, or greater, or within any range defined between any two of the foregoing values, based on the total weight of the TIM.

7. Other Additives

In some exemplary embodiments, the TIM comprises one or more additional additives. Exemplary additives include crosslinkers, such as alkylated melamine formaldehyde resin, pigments, and solvents, such as iosparaffinic fluids. In some exemplary embodiments, the TIM may comprise the one or more additives in an amount as little as 0.1 wt. %, 0.5 wt. %, 1 wt. % as great as 1.5 wt. %, 2 wt. %, 5 wt. %, 10 wt. %, or within any range defined between any two of the foregoing values, based on the total weight of the TIM.

8. Exemplary Formulations of the Thermal Interface Material

In a first non-limiting illustrative embodiment, the TIM includes about 1 wt. % to about 25 wt. % polymer, about 50 wt. % to about 95 wt. % thermally conductive filler, and about 0.1 wt. % to about 5 wt. % ion scavenger. In a more particular embodiment, the ion scavenger is an acid amide compounds, such as hydrazide or dihydrazide. In an even more particular embodiment, the ion scavenger is selected from decanedicarboxylic acid dietlythyl oyl hydrazide; 3-(N-salicyloyl)amino-1,2,4-triazole; and 2', 3-bis [[3-[3, 5-di-tert-butyl-4-hydroxyphenyl] propionic]]propionyl hydrazide In a second illustrative embodiment, which is a more particular embodiment of the first illustrative embodiment, the TIM further includes about 1 wt. % to about 5 wt. % of at least one phase change material.

In a third illustrative embodiment, which is a more particular embodiment of either the first or the second illustrative embodiments, the TIM includes about 0.1 wt. % to about 5 wt. % of at least one crosslinker.

In a fourth illustrative embodiment, which is a more particular embodiment of any of the first to third illustrative embodiments, the TIM includes about 0.1 wt. % to about 5 wt. % of at least one coupling agent.

In a fifth illustrative embodiment, which is a more particular embodiment of any of the first to fourth illustrative embodiments, the TIM includes about 0.1 wt. % to about 5 wt. % of at least one phase change material.

9. Exemplary Properties of the Thermal Interface Material

In some exemplary embodiments, a material thermal interface material including an ion scavenger has a resistance to degradation greater than a similarly formulated thermal interface material not including an ion scavenger. The resistance to degradation may be characterized by an Oxygen Induced Time (OIT) test, such as determined by ASTM D3859-07, the disclosures of which are hereby incorporated by reference in their entirety. Longer OIT times indicate better thermal stability.

In some exemplary embodiments, the OIT of a TIM including an ion scavenger is as little as 20% greater, 25% greater, 30% greater, 50% greater, 75% greater, 100% greater, as great as 150% greater, 200% greater, 300% greater, 375% greater, 400% greater, 500% greater, or more than the OIT of a similarly formulated TIM not including an ion scavenger, or within any range defined between an y two of the foregoing values.

In some exemplary embodiments, the OIT of a TIM including an ion scavenger is as little as 30 minutes, 45 minutes, 60 minutes, as great as 75 minutes, 90 minutes, 120 minutes, 150 minutes, or greater or within any range defined between an y two of the foregoing values.

In some exemplary embodiments, the OIT of a TIM in contact with a metal surface is as little as 15 minutes, 20 minutes, 30 minutes, 45 minutes, as great as 60 minutes, 75 minutes, 90 minutes, 120 minutes, 150 minutes, or greater or within any range defined between any two of the foregoing values.

In some exemplary embodiments, the thermal interface material has a thermal impedance as little as 0.05° C. cm$^2$/W, 0.08° C. cm$^2$/W, 0.09° C. cm$^2$/W, as high as 0.1° C. cm$^2$/W, 0.5° C. cm$^2$/W, 1° C. cm$^2$/W, 2° C. cm$^2$/W, or within any range defined between any two of the foregoing values.

In some exemplary embodiments, the thermal interface material has an unchanged thermal impedance and no visible degradation of the TIM after undergoing a Highly Accelerated Stress Test (HAST) conditioning at a temperature of 120° C., a pressure of 2 atmospheres, and a relative humidity of 85%. The for thermal impedance may be unchanged for as short as 90 hours, 120 hours, 150 hours, as long as 180 hours, 190 hours, 200 hours, or longer, or within any range defined between any two of the foregoing values.

In some exemplary embodiments, the thermal interface material has an unchanged thermal impedance and no visible degradation of the TIM after undergoing a baking test conditioning at a temperature of 150° C. The for thermal impedance may be unchanged for as short as 1000 hours, 1500 hours, 2000 hours, as long as 2200 hours, 2500 hours, 2800 hours, or longer, or within any range defined between any two of the foregoing values.

B. Methods of Forming a Thermal Interface Material

In some exemplary embodiments, the TIM is prepared by combining the individual components in a heated mixer and blending the composition together. The blended composition may then be baked.

In some exemplary embodiments, the TIM is baked at a temperature as low as 25° C., 50° C., 75° C., 80° C., as high as 100° C., 125° C., 150° C., 170° C., or within any range defined between any two of the foregoing values. In some exemplary embodiments, the TIM is baked for as little as 0.5 minutes, 1 minute, 30 minutes, 1 hour, 2 hours, as long as 8 hours, 12 hours, 24 hours, 36, hours, 48 hours, or within any range defined between any two of the foregoing values. An exemplary baking condition is 80° C. for 30 minutes.

C. Applications Utilizing the Thermal Interface Material

Figure 1:
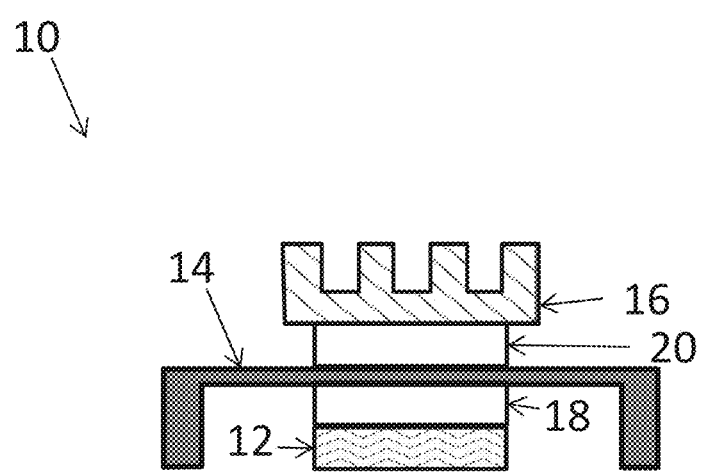
FIG. 1 schematically illustrates a typical electronics package structure.

Referring again to FIG. 1, in some exemplary embodiments, the thermal interface material including an ion scavenger is positioned as a TIM 1 between an electronic component 12 and a heat spreader 14, as indicated by TIM 18. In some exemplary embodiments, the thermal interface material including an ion scavenger is positioned as a TIM 2 between an a heat spreader 14 and a heat sink 16, as indicated by TIM 20. In some exemplary embodiments, the thermal interface material including an ion scavenger is positioned as a TIM 1.5 (not shown) between an electronic component 12 and a heat sink 16.

EXAMPLES

TIMs were prepared according to the formulations provided in Table 1.

TABLE 1

Formulations (wt. %) for Example 1 and Comparative Examples 1 and 2

| | Ex. 1 | Comp. Ex. 1 | Comp. Ex. 2 |
|---|---|---|---|
| Elastomer | 6.22 | 6.22 | 6.22 |
| Wax | 1.78 | 1.78 | 1.78 |
| Total antioxidant | 0.5 | 0.5 | 0.5 |
| Titanium coupling agent | 0.67 | 0.67 | 0.67 |
| Aluminum powder thermally conductive filler | 90.83 | 90.83 | 90.83 |
| Crosslinker | 0.6 | — | 0.6 |
| Ion scavenger | 0.5 | — | — |

To prepare example 1, 6.22 parts (weight) Kraton elastomer (a hydroxyl-terminated ethylene butylene copolymer, specialty mono-ol), 1.78 parts of a microcrystalline wax with a melting point of about 45° C., 0.5 total parts of an antioxidant mixture were combined and blended in a heated mixer until the combination had melted and had a substantially homogeneous appearance. 0.67 parts Titanium IV 2, 2 (bis 2-propenolatomethyl) butanolato, tris(dioctyl)pyrophosphato-O coupling agent was added, and the combination was blended, again until the combination had a substantially homogeneous appearance. 90.83 parts of Aluminum powder, a thermally conductive filler, was added, and the combination was again blended until it had a substantially homogeneous appearance. Finally 0.6 parts of a Cymel crosslinker resin(alkylated melamine formaldehyde resin) and 0.5 parts of an ion scavenger Songnox® 1024 were added. The final combination had a homogeneous appearance.

To prepare comparative example 1, 6.22 parts Kraton elastomer (a hydroxyl-terminated ethylene butylene copolymer, specialty mono-ol), 1.78 parts of a microcrystalline wax with a melting point of about 45° C., and 0.50 wt % antioxidant were combined and blended in a heated mixer until the combination had melted and had a substantially homogeneous appearance. 0.67 parts Titanium IV 2, 2 (bis 2-propenolatomethyl) butanolato, tris(dioctyl)pyrophosphato-O was added, and the combination was blended, again until the combination had a substantially homogeneous appearance. 90.83 parts of Aluminum powder was added, and the combination was again blended until it had a substantially homogeneous appearance.

To prepare comparative example 2, 6.22 parts Kraton elastomer (a hydroxyl-terminated ethylene butylene copolymer, specialty mono-ol), 1.78 parts of a microcrystalline wax with a melting point of about 45° C., and 0.50 wt % antioxidant were combined and blended in a heated mixer until the combination had melted and had a substantially homogeneous appearance. 0.67 parts Titanium IV 2, 2 (bis 2-propenolatomethyl) butanolato, tris(dioctyl)pyrophosphato-O was added, and the combination was blended, again until the combination had a substantially homogeneous appearance. 90.83 parts of Aluminum powder was added, and the combination was again blended until it had a substantially homogeneous appearance. Finally 0.60 parts Cymel resin(alkylated melamine formaldehyde resin) was added. The final combination had a homogeneous appearance.

For each TIM, a Highly Accelerated Stress Test (HAST) was performed. The TIM was taped between liner films at 90° C. for 15 minutes, and cut to a 10 mm square. The liners were removed and the square sample placed between a nickel-coated copper spreader and a silicon die, creating a "test sandwich." The sample was conditioned at a temperature of a temperature of 130° C., a pressure of 2 atmospheres, and a relative humidity of 85% for 96-192 hours using an environmental chamber supplied by ESPEC. The thermal impedance of the sample was determined before and after the sample conditioning using flash diffusivity of the test sandwich. Flash diffusivity was determined using a Netzsch LFA 447 equipment with a Xenon light source.

The material was periodically checked, and the HAST time was recorded as the final time in which the material met the following criteria: (1) There was no significant visible degradation of the TIM, and no delamination between the TIM and the nickel-coated copper spreader or between the TIM and the silicon die. (2) In addition, the thermal performance did not significantly degrade (testing for thermal performance is further described below). Specifically, the thermal impedance of the test sandwich was the same after HAST testing compared to before (both values were 0.08-0.09° C.cm/W).

For each TIM, a baking test was performed. The TIM was taped between liner films at 90° C. for 15 minutes, and cut to a 10 mm square. The liners were removed and the square sample placed between a nickel-coated copper spreader and a silicon die, creating a "test sandwich." The sample was subjected to a 150° C. baking oven, for 200 to 3000 hours using an Oven D2F-6050, supplied by Shanghai JING-HONG. The thermal impedance of the sample was determined before and after the sample conditioning using flash diffusivity of the test sandwich. Flash diffusivity was determined using a Netzsch LFA 447 equipment with a Xenon light source.

The material was periodically checked, and the baking time was recorded as the final time in which the material met the following criteria: (1) There was no significant visible degradation of the TIM, and no delamination between the TIM and the nickel-coated copper spreader or between the TIM and the silicon die. (2) In addition, the thermal performance did not significantly degrade (testing for thermal performance is further described below). Specifically, the thermal impedance of the test sandwich was the same after baking test compared to before (both values were 0.08-0.09° C.cm/W).

For each TIM, an Oxygen Induced Time (OIT) test was conducted following by ASTM D3859-07 standard. OIT is a standardized test performed in a DSC (Differential Scanning calorimeter) which measures the level of thermal stabilization of the material tested. Longer time indicates better thermal stability. 10-30 mg mixed samples described above, will go OIT test through DSC Q100, supplied by TA instrument. The test condition is under 50 ml/min $O_2$ flow rate and 210° C. peak temperature (with 20° C./min ramp up).

The OIT, HAST and baking test results are presented in Table 2:

TABLE 2

| Performance | Comp. Ex. 1 | Comp. Ex. 2 | Ex. 1 |
|---|---|---|---|
| Average TI at time zero (° C. · $cm^2$/W) | 0.08-0.09 | 0.08-0.09 | 0.08-0.09 |
| Oxidative Induction Time - 210° C. (min) | 35.85 | 42.15 | 77.54 |
| HAST - 130° C., 85% RH, 2 atm (hours) | 96 | 192 | >192 |
| 150° C. baking test (hours) | 1000 | 1500 | >=2800 |

As shown in Table 2, Example I had similar initial thermal impedance as Comparative Example I and Comparative Example II, and similar or better performance in the HAST test. In addition, Example I had significantly longer OIT and baking test results times than either Comparative Example I or Comparative Example II.

A second set of TIMs were prepared according to the formulations provided in Table 3.

TABLE 3

| Formulations (wt. %) for Examples 2-4 and Comparative Examples 4-5 | | | | | |
|---|---|---|---|---|---|
| | Ex. 2 | Comp. Ex. 3 | Ex. 3 | Ex. 4 | Comp. Ex. 4 |
| PCM45F | 100 | 100 | — | — | — |
| Elastomer | — | — | 12.5 | 12.5 | 12.5 |
| Titanium coupling agent | — | — | 1.5 | 1.5 | 1.5 |
| Aluminum powder thermally conductive filler | — | — | 71.66 | 71.66 | 71.66 |
| Zinc oxide powder thermally conductive filler | — | — | 14.34 | 14.34 | 14.34 |
| Ion scavenger | 0.6 | — | 0.6 | 1.8 | — |

To prepare example 2, 100 parts PCM45F (supplied by Honeywell International, Inc.), a TIM material including a phase change material, and 0.6 parts Songnox® 1024 (supplied by SONGWON) were combined and blended in a heated mixer until the combination had melted and had a substantially homogeneous appearance.

Comparative example 3 was PCM45F without the ion scavenger.

To prepare example 3, 12.5 parts of Kraton elastomer (a hydroxyl-terminated ethylene butylene copolymer, specialty mono-ol), 1.5 parts of Titanium IV 2-propanolato, tris isooctadecanoato-O, and 0.6 parts ion scavenger Songnox® 1024 were combined and blended until the combination had a substantially homogeneous appearance. 71.66 parts of Aluminum powder, and 14.34 parts of Zinc oxide powder were added, and the combination was again blended until it had a substantially homogeneous appearance.

To prepare example 4, 12.5 parts of Kraton elastomer (a hydroxyl-terminated ethylene butylene copolymer, specialty mono-ol), 1.5 parts of Titanium IV 2-propanolato, tris isooctadecanoato-O, and 1.8 parts ion scavenger Songnox® 1024 were combined and blended until the combination had a substantially homogeneous appearance. 71.66 parts of Aluminum powder, and 14.34 parts of Zinc oxide powder were added, and the combination was again blended until it had a substantially homogeneous appearance.

To prepare comparative example 4, 12.5 parts of Kraton elastomer (a hydroxyl-terminated ethylene butylene copolymer, specialty mono-ol), and 1.5 parts of Titanium IV 2-propanolato, tris isooctadecanoato-O were combined and blended until the combination had a substantially homogeneous appearance. 71.66 parts of Aluminum powder, and 14.34 parts of Zinc oxide powder were added, and the combination was again blended until it had a substantially homogeneous appearance.

For each TIM, an Oxygen Induced Time (OIT) test was conducted following by ASTM D3859-07 standard as discussed above. OIT test results of above materials are presented in Table 4:

TABLE 4

| OIT Test Results | |
|---|---|
| Samples | OIT Result (min) |
| Ex. 2 | 57.92 |
| Comp. Ex. 3 | 24.56 |
| Ex. 3 | 92.58 |
| Ex. 4 | 145.50 |
| Comp. Ex. 4 | 23.28 |

As shown in Table 4, Example 2 had significantly longer OIT times than Comparative Example 3, and Examples 3 and 4 had significantly longer OIT times than Comparative Example 4. In addition, Example 4, which had twice the ion scavenger as Example 3, had significantly longer OIT times than Example 3.

While this invention has been described as having exemplary designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. An electronic component comprising:
a heat sink having a copper surface;
an electronic chip;
a thermal interface material positioned between the heat sink and electronic chip and including a first surface in direct contact with the copper surface of the heat sink, the thermal interface material including:
at least one elastomeric polymer;
at least one thermally conductive filler present in a total amount between 75 wt. % and 95 wt. %, based on a total weight of the thermal interface material; and
at least one ion scavenger.

2. The electronic component of claim 1, wherein the ion scavenger comprises 2',3-bis[[3-[3,5-di-tert-butyl-4-hydroxyphenyl]propionic]]propionyl hydrazide in an amount between 0.1 wt. % and 5 wt. %, based on a total weight of the thermal interface material.

3. The electronic component of claim 2, wherein the ion scavenger comprises 2',3-bis[[3-[3,5-di-tert-butyl-4-hydroxyphenyl]propionic]]propionyl hydrazide in an amount between 0.1 wt. % and 2 wt. %, based on a total weight of the thermal interface material.

4. The electronic component of claim 1, wherein the ion scavenger comprises decamethylenedicarboxylic acid disalicyloylhydrazide in an amount between 0.1 wt. % and 5 wt. %, based on a total weight of the thermal interface material.

5. The electronic component of claim 4, wherein the ion scavenger comprises decamethylenedicarboxylic acid disalicyloylhydrazide in an amount between 0.1 wt. % and 2 wt. %, based on a total weight of the thermal interface material.

6. The electronic component of claim 1, wherein the at least one thermally conductive filler is present in a total amount between 85 wt. % and 95 wt. %, based on a total weight of the thermal interface material.

7. The electronic component of claim 1, wherein the elastomeric polymer is present in an amount between 2 wt. % and 10 wt. %, based on a total weight of the thermal interface material.

8. The electronic component of claim 1, further comprising a phase change material in the form of a wax, the wax present in an amount between 0.5 wt. % and 3 wt. %, based on a total weight of the thermal interface material.

9. The electronic component of claim 1, further comprising a coupling agent present in an amount between 0.1 wt. % and 1.5 wt. %, based on a total weight of the thermal interface material.

10. The electronic component of claim 1, wherein the thermal interface material includes a second surface in direct contact with the electronic chip.

11. An electronic component comprising:
a heat sink having a nickel surface;
an electronic chip;
a thermal interface material positioned between the heat sink and electronic chip and including a first surface in direct contact with the nickel surface of the heat sink, the thermal interface material including:
at least one elastomeric polymer;
at least one thermally conductive filler present in a total amount between 75 wt. % and 95 wt. %, based on a total weight of the thermal interface material; and
at least one ion scavenger.

12. The electronic component of claim 11, wherein the ion scavenger comprises 2',3-bis[[3-[3,5-di-tert-butyl-4-hydroxyphenyl]propionic]]propionyl hydrazide in an amount between 0.1 wt. % and 5 wt. %, based on a total weight of the thermal interface material.

13. The electronic component of claim 12, wherein the ion scavenger comprises 2',3-bis[[3-[3,5-di-tert-butyl-4-hydroxyphenyl]propionic]]propionyl hydrazide in an amount between 0.1 wt. % and 2 wt. %, based on a total weight of the thermal interface material.

14. The electronic component of claim 11, wherein the ion scavenger comprises decamethylenedicarboxylic acid disalicyloylhydrazide in an amount between 0.1 wt. % and 5 wt. %, based on a total weight of the thermal interface material.

15. The electronic component of claim 14, wherein the ion scavenger comprises decamethylenedicarboxylic acid disalicyloylhydrazide in an amount between 0.1 wt. % and 2 wt. %, based on a total weight of the thermal interface material.

16. The electronic component of claim 11, wherein the at least one thermally conductive filler is present in a total amount between 85 wt. % and 95 wt. %, based on a total weight of the thermal interface material.

17. The electronic component of claim 11, wherein the elastomeric polymer is present in an amount between 2 wt. % and 10 wt. %, based on a total weight of the thermal interface material.

18. The electronic component of claim 11, further comprising a phase change material in the form of a wax, the wax present in an amount between 0.5 wt. % and 3 wt. %, based on a total weight of the thermal interface material.

19. The electronic component of claim 11, further comprising a coupling agent present in an amount between 0.1 wt. % and 1.5 wt. %, based on a total weight of the thermal interface material.

20. The electronic component of claim 11, wherein the thermal interface material includes a second surface in direct contact with the electronic chip.

* * * * *